Jan. 5, 1965 R. I. BERGE ET AL 3,164,749

ELECTRONIC COMPONENT PACKAGING

Filed Feb. 13, 1961 2 Sheets-Sheet 1

INVENTORS
RALPH I. BERGE
ANTHONY B. CISTOLA
CHARLES O. WILSON
BY George J. Netter
ATTORNEY 3,164,749

ELECTRONIC COMPONENT PACKAGING

Ralph I. Berge, Endicott, Anthony B. Cistola, Vestal, and Charles O. Wilson, Chenango Bridge, N.Y., assignors to International Business Machines Corporation, New York, N.Y., a corporation of New York Filed Feb. 13, 1961, Ser. No. 88,926
4 Claims. (Cl. 317—101)

The invention is concerned generally with the packaging of electronic components, and more particularly with a novel package unit for such components having high resistance to vibration and shock.

Present day trends in the design of electronic components are in the direction of producing smaller and lighter components which can be arranged relative to one another to form small, compact units, or modules, in which a great number of individual elements are contained in a very closely spaced relation.

However, due to the growing tendency toward increased reduction in size, a difficulty has arisen in making good permanent electrical connections because of the smallness in size of connecting wires which can be broken on being subjected to shocks or vibration of magnitudes considered heretofore to be harmless. Thus, although for conventional-sized components the associated relatively heavy connectors can withstand substantial shock and vibration this is not true with the smaller-sized components, especially those of the so-called microminiature class where special measures have to be taken to prevent damage to the connectors and/or the components themselves.

A further consequence of component miniaturization is that individual components when arranged in a high component-density module, for example, serve to inhibit the ready transfer of heat away from adjacent components. Also, because of the relative smallness of the entire item cooling is a difficult problem.

It has, therefore, been found necessary in the past when a number of small components are arranged together in a network or circuit to provide means for absorbing shocks and vibration, and restraining relative movement between individual components. The latter insures against breakage of the connectors or the components themselves from repeated mutual movement resulting in either fatigue of a joining member or a single-shock break.

Exemplifying customary shock and vibration avoidance techniques are the well-known type of modules wherein the circuits are encapsulated in a potting compound of a synthetic resin material, for example, which is substantially inflexible. The underlying theory is that the encapsulating material is to provide a high degree of rigidity to the entire structure, and, in fact, to make the final structure a substantial entity itself. A disadvantage of units of this type is that in case there is a failure of one of the components contained within the structure, repair, or even salvage for that matter, is not a feasible process with the only recourse being to discard the complete structure and replace it.

Further, although it is true a potted circuit assembly is provided with adequate rigidity by the potting compound to prevent relative movement between the different components, a direct blow or shock is of course not absorbed, and, in fact, is directed in substantially full force to the components by the encapsulation material itself.

Still further, it is apparent that an encapsulated circuit cannot be readily tested by other than terminal members which are situated externally of the encapsulation body.

An even more serious drawback to conventional potting or encapsulation particularly as applied to three-dimensional circuit assemblies of components is that those components located at remote locations from the outer surface of the structure are subject to high operating temperatures considerably in excess of those that would be expected in the same structures not encapsulated. This is a result of the fact that the more centrally located components are only cooled by conduction of heat away from the components through the potting compound which inherently is a poor heat conductor.

The temperature limitation is generally reflected in the design of such circuits as a lowered "component-density," i.e., fewer components per unit volume, thereby increasing the distance between adjacent components and decreasing the number of heat sources per unit volume. However, a lowered component-density clearly implies additional space requirements for the structure, and also a substantial increase in weight since the additional space between the components is filled with a relatively high density material.

It is, therefore, a primary object of the invention to provide an electronic circuit package having good resistance to shock and vibration and not subject to customary encapsulation technique objections.

Another object of the invention is to provide such a circuit package which is relatively light-weight and easy to fabricate on a quantity basis.

A further object of the invention is to provide a package for microminiature components arranged in a circuit having the features of light weight and high resistance to vibration and shock.

A further object is to provide a special electronic circuit package having a high component-density.

Another object is the provision of a circuit package which can be maintained and repaired easily.

A still further object is the provision of a composite package having exceptional resistance and vibration characteristics composed of individual circuit units arranged in book-like arrangement.

Briefly, the invention contemplates the forming of an integral electronic package unit by embedding a finished essentially flat circuit of electronic components in a flexible material providing a sheet-like structure. A further aspect of the invention includes arranging a plurality of these novel circuit sheets in cooperative relationship to form a "book" assembly, electrical connection to which is provided along one or more edges.

The foregoing and other objects, features and advantages of the invention will be apparent from the following more particular description of preferred embodiments of the invention as illustrated in the accompanying drawings.

Figure 6A:
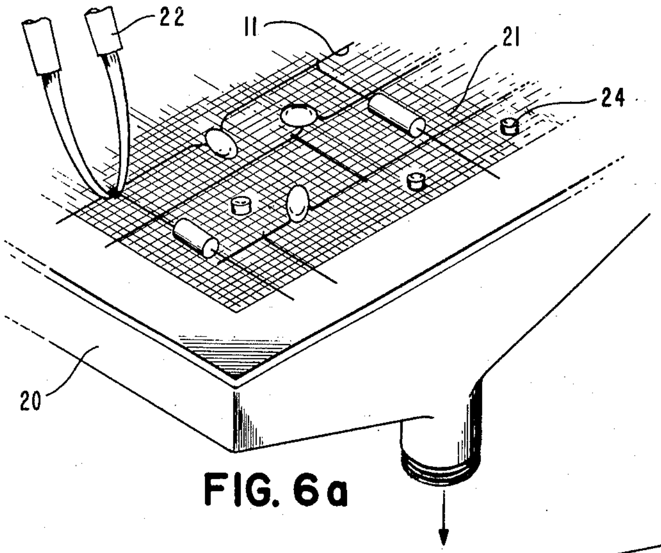

FIG. 6*a*, *b*, and *c* is a diagrammatic representation of one manner of producing the special package of the invention.

Figure 1:
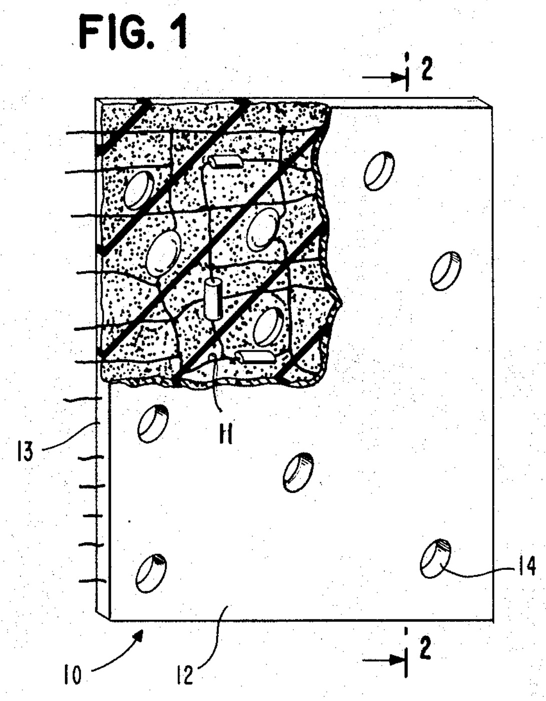
FIG. 1 is a perspective, partially fragmentary view of an electronic component package made in accordance with the invention.

With particular reference to FIG. 1, the electronic component package 10 of the invention is seen to comprise broadly a preformed electronic circuit 11 of desired configuration contained in embedded relation within a flexible support body 12 of sheet-like geometry. Adjacent an edge of the support body 12 are located a plurality of connector wires illustrated generally at 13 which collectively form the means for making the required electrical contact between the circuit 11 and peripheral equipment (not shown). For reasons which will be set forth more fully below, these wires are brought out at, or through, an edge rather than from one of the facing surfaces of the support body.

At spaced intervals throughout the support body 12 there are provided openings 14 which pass completely through the body. These serve as conducting channels through which cooling air can be moved to cool the electronic components during operational use. As will be brought out more fully below, these openings are located in component-free and electrical-lead-free portions of the support body so as to retain full protection of the enclosed circuit.

Figure 2:
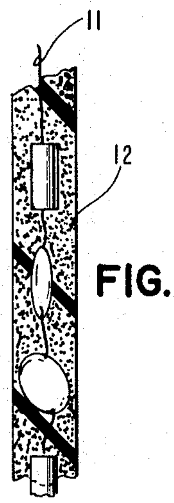
FIG. 2 is a sectional view taken along line 2—2 of FIG. 1.

As is shown in FIG. 2 the thickness of the support body 12 is such that it provides a complete covering of the components, and, therefore, will have a maximum thickness only slightly greater than that of the thickest of the components composing the circuit. Any excess thickness of the support body is not only unnecessary for strength, shock and vibration resistance, but also would serve to reduce the rate of heat transfer away from the components thereby decreasing effectivity. It is therefore to be emphasized that a fundamental contemplation of the invention is that the support body 12 have an average thickness no greater than is necessary to cover the electrical components of greatest dimension to be included therein. In stating the thickness requisites, it is tacitly assumed that connecting wires or members associated with these circuit parameters are of no greater thickness. If this is not the case then the thickness of the connecting means is determinative of the support body thickness.

It is basic to the invention that the support body 12 be composed of a material having a high degree of flexibility as well as the ability to maintain its shape and rigidity when exposed to temperature environments which the electronic components themselves are able to withstand successfully. Thus, although exceptional conditions might require performance at greater temperatures, for present purposes those materials that can meet the other requisites throughout temperature ranges extending up to about 180° F., are full satisfactory.

In order to provide shock and vibration protection for the circuit 11 in the manner of the invention, the support body material must possess sufficient resiliency so that shocks and vibrations transferred to the circuit have a large proportion of their force absorbed by passage through the body. As is evidenced by those materials specified below, best results are believed obtainable in this respect with materials of a flexible cellular nature, or, more generally, a material in which the solid portion thereof is broken up by many small air spaces.

A further aspect of the invention which can directly affect the choice of material for the support body is that of repairability. Thus, in the case of failure of a component in the embedded circuit it is intended that it be physically removed from the circuit and embedding body (by cutting out, for example), a new component substituted in its place and the area of the repair reconstituted.

The materials found to provide the best overall results are a group of room-temperature-vulcanizing (RTV) silicone rubber compounds manufactured by the Dow Chemical Company of Midland, Michigan. These compounds not only form a resilient, water-resistant, electrically nonconductive body for containing an electrical circuit, but also can be sprayed at room temperature.

Another type of material which has been found to be particularly effective as a support body material is what is termed "flock." This material consists of a shredded or fibrous aggregate, such as felt, carried by a suitable adhesive binder such as a silicone varnish. Although this is not a cellular material as specified above, the individual shreds of felt are in the main separated from one another by air spaces which serve in the same manner as the air cells of the silicone rubber substrate discussed above.

Figure 3:
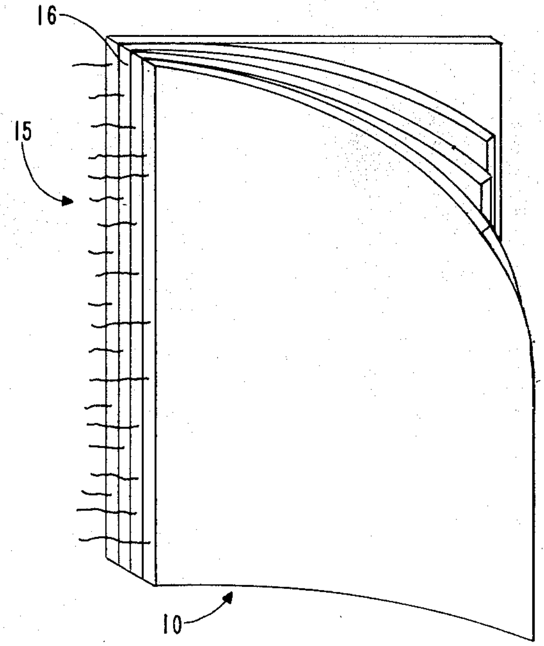
FIG. 3 is a composite book of circuit packages of FIG. 1.

An assembly 15 of the circuit sheets offering a number of advantages is that illustrated in FIG. 3. It is comprised of a plurality of circuit sheets 10 made in the manner described herein and arranged in a face-opposed, or "book," relation and "bound" along one edge 16. The binding can be accomplished in any one of a number of different ways, such as by applying adhesive to the facing portions of the sheets adjacent the edge to be bound, utilizing metal or plastic clips, and the like.

It is to be noted that the bound edge is formed from those individual edges of the sheets which have the lead wires extending therefrom. These wires are woven, or braided, together into the binding edge of the assembly and connection is made to external equipment at the end of a short drop-type cable (not shown).

Figure 4:
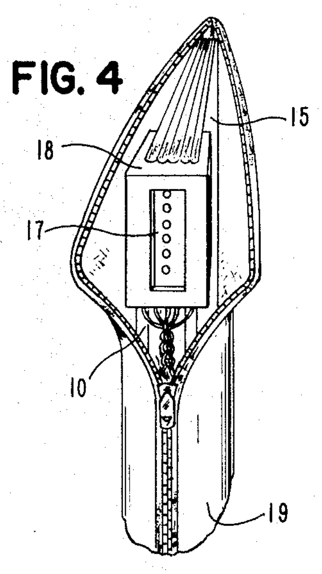
FIG. 4 illustrates a special connecting means for the composite unit of FIG. 3.

A modification of the book-like structure illustrated in FIG. 3 is that shown in FIG. 4 where a single connector means 17, for example, of the pin type is provided. This connector is an integral part of the binding of the assembly and the individual leads are fed into the appropriate portions of the connector with external connection made by an appropriate mating connector. This not only facilitates quick connecting and disconnecting of the unit, but also provides a neater and more sure connection over the arrangement of FIG. 3 in addition to serving as an edge binding means through the gripping action of its U-shaped body member 18.

Also, it is preferable that such a connector-binder be provided on the back side, i.e., the side facing the edges of the sheets 10, with grooves separated from one another slightly so that when the individual sheets are incorporated against the combination edge binding means and connector means 17 they will be separated slightly from one another. In this way, cooling air is permitted to pass between and circulate from one sheet to the other providing a more uniform and consistent cooling effect to the entire structure.

Figure 5:
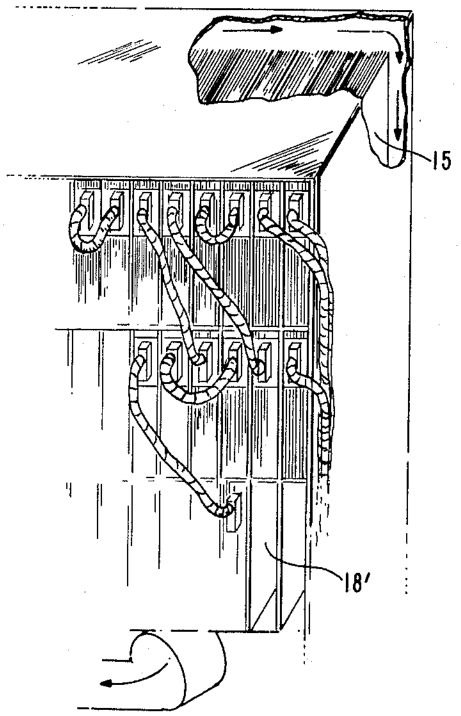
FIG. 5 illustrates a typical mounting of a composite unit.

An especially gainful way of mounting such book units as a composite whole is illustrated in FIG. 5. As shown, individual compartments or cubicles 18' are provided of sufficient dimensions to receive the books 15 individually, i.e., one to a cubicle, in a close fitting relationship. Cooling air means are provided for passing cooling air through and over the surfaces of each of such books. In such an arrangement, not only are the individual books readily available on merely disconnecting the appropriate cable connector and pulling the books out, but also this arrangement provides a further reinforcing effect in that the wall portions of the cubicle are structurally integral with a vehicle member, housing, or the like, on which the complete unit is mounted. The latter feature serves to enhance all of the sheet-like assemblies in their resistance to shock and vibration.

Turning again to FIG. 4, it is seen that an envelope or covering 19 is provided in which a complete book can be included and thereby isolated from the external environment. It is contemplated that such an envelope would have its greatest utility where it is necessary that an assembly 15 be situated in a location of exceptionally high temperature. In this case, the envelope is made of a material having good heat insulating properties, such as a glass fiber material, and auxiliary cooling means are utilized to lower the temperature within the envelope. Any suitable securing means can be utilized to close the envelope as long as it provides a substantially sealing relationship for the interior excepting any openings or conduit means for passing a coolant therethrough.

Figure 6B:
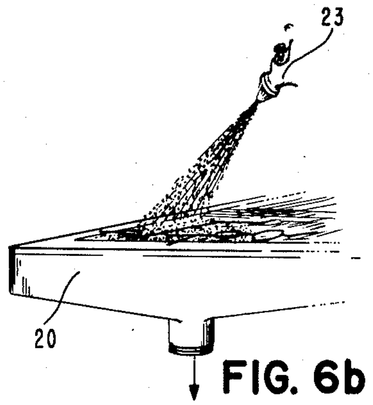
Figure 6C:
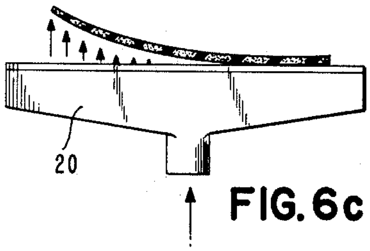

With reference now particularly to FIG. 6, there is illustrated one manner of producing the individual circuit sheets or component packages 10 of the invention which is seen to consist broadly of the following steps: (1) fabrication of the circuit itself, and (2) establishing the support body or sheet in surrounding relation to the circuit network.

The first step (FIG. 6*a*), is the arrangement of the various components comprising the desired circuit on the upper surface of a special table 20 with the ends of the individual component connectors in contact with the appropriate connectors of other components according to the predetermined circuit configuration. The table 20 includes a substantially flat horizontal portion 21 constructed of a material such as fine wire gauze or mesh and is provided by means of a vacuum pump (not shown) with a flow of air downwardly through the upper surface which exerts a pulling or retaining force on the circuit 11 vectorially directed toward the upper surface.

With the components so retained, the connectors of the components are then brought into appropriate permanent electrical contacting relation to one another by soldering, for example, or by welding using suitable means such as the "tweezer" welding tips 22 illustrated. This operation is conveniently done with only the reduced air pressure on the portion 21 retaining the relative locations of the different components to one another, and contact of the tweezer tips to the connectors of the components only causes a slight displacement of the components.

After the circuit configuration is formed and permanent electrical connection is made at the appropriate places in the circuit, including the provision of external connection wires, the next step is the spraying of one of the above-described support body materials onto the upper surface of the circuit while it is still retained against the upper surface of the flat portion 21. This can be accomplished by passing a spray from a spray gun 23 over the surface once, or perhaps several times, to deposit a thin film of the spray material onto not only the components themselves, but between the components forming a structurally reinforcing bridge between them. Although, in FIGS. 1 and 2 the sheet is shown as having an even and uniform thickness throughout, this is not meant to preclude the situation where those portions of the sheet between the components are of reduced thickness.

After a sufficient amount of time is allowed for setting up of the sprayed support body material sufficiently so that the component sheet is of firm and even consistency, the direction of air is reversed within the support table 20 and pressurized air is directed upwardly and outwardly to assist in removing the sprayed sheet and circuit from the air pressure retaining portion of the table. This is because a certain amount of the spray material will usually adhere to the gauze or mesh and if the composite sheet is lifted by a pulling action alone, a twisting or bending force might be created of sufficient strength to cause damage to certain of the circuit parameters or their inter-connections. However, if a blast of air presses upwardly against the newly formed package at the same time that a lifting force is applied, the possibility that this difficulty will arise is substantially obviated.

Although in certain cases merely spraying one side of the circuit 11 would provide a satisfactory unit, it is considered that a far superior package results when the circuit is completely covered by the support body 12. Accordingly, when the circuit has been coated with the spray material on one side as above, the half-coated unit is turned over and sprayed as before on its uncoated side. The double-spraying technique furnishes a finished circuit package where the circuit is equally protected on all sides against moisture, shocks, vibrations and the possibility of short circuits.

For providing the openings 14, a plurality of forms 24 can be disposed between components of the circuit during spraying so that when the finished sheet is produced those positions occupied by the forms will be free of the spray material and thus define passages through the sheet. These forms can be made of a wax, for example, which can be removed easily by merely heating.

It is clear, therefore, that a new and distinctive electrical circuit package is provided here having superior qualities of shock and vibration resistance as well as a number of concomitant advantages. Thus, an increase in reliability is obtained by permitting the use of welded connections between the individual components. This was not possible before in a unit which had to withstand high shocks and vibrations because of the deleterious effect on the welded connections. However, with the mechanical insulation afforded by a support body described herein, it is possible to produce a relatively large sheet-like circuit assembly, having welded interconnections, which is capable of withstanding what would otherwise be considered excessive vibration and shock loads.

A substantial saving is provided in assembly costs due to the essentially single plane, or two-dimensional, configuration of the sheets 10 in that they are easily adapted to automatic assembly. Also, a flexible sheet-like unit of this type can be conformed to fit into any number of different shaped locations which otherwise might be considered ill suited for accommodating more conventional three-dimensional rigid electronic circuits. Thus, such an assembly could be formed to fit into a slot-shaped or curved enclosure without fear of short circuits between the components or to the enclosure frame, or reducing, in any way, the capability of such a package to withstand unfavorable environments.

Further, in this connection, the use of relatively large sheet-circuits would substantially reduce the number of cable connectors for a given system thereby reducing weight and increasing reliability by minimizing connector difficulties.

Such units are particularly advantageous for use in aircraft or missiles where a large number of components are required, and, of course, shock and vibration loads are quite severe. For example, either individual package units or books of such units can be easily adapted to fit into any number of locations within the aircraft or missile. Still further, the airframe itself can be easily conformed to serve the dual function of airframe and electronics rack by adding cubicles as illustrated in FIG. 5.

In fact, many airframe structures are constructed of "pigeonhole" type bulkheads which can be used directly as a supporting housing thereby eliminating the need for non-functional mechanical hardware such as racks, and the like.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. An electronic component package comprising, in combination, a plurality of discrete electronic circuit components having individual lead wires arranged in a lattice-like network with said lead wires interconnected in a predetermined configuration to provide a substantially integral member, and a flexible sheet-like body in surrounding and intimate contacting relation to said network and interconnections whereby an integral flexible sheet-like circuit package is formed.

2. A circuit package comprising a plurality of stacked circuit sheets each including a circuit network of discrete components contained within a flexible sheet of a synthetic resin material and having connection wires extending from an edge thereof and with all the wires extending from one side of said stack, and means for securing the edges of said circuit sheets from which said wires extend to one another to form a book-like circuit package.

3. An electronic component circuit package comprising: a plurality of substantially uniformly dimensioned circuit sheets, each of said sheets including a circuit network of discrete electrical components having individual lead wires interconnected to form a substantially sheet-like structure, and a flexible resilient body member disposed in surrounding and intimate contacting relationship to said circuit network and tightly adherent thereto, said circuit sheets being arranged in face surface contacting relationship with their edges in substantial registry with one another and electrical connection to said circuits being provided by lead wires arranged along a single common edge of said sheets; and binder means for securing the common electrical connection edges of said sheets together to form a composite electronic circuit book of individually accessible circuit pages.

4. An electronic component circuit package comprising:

a plurality of substantially uniformly dimensioned circuit sheets, each of said sheets including a circuit network of electrical components interconnected to form a substantially sheet-like structure, and a flexible resilient body member disposed in surrounding and intimate contacting relationship to said circuit network and tightly adherent thereto, said circuit sheets being arranged in face surface contacting relationship with their edges in substantial registry with one another and electrical connection to said circuits being provided by lead wires arranged along a single common edge of said sheets, the body member of each of said sheets containing openings extending through the facing surfaces thereof for admitting cooling air; and binder means for securing the common electrical connection edges of said sheets together to form a composite electronic circuit book of individually accessible circuit pages.

References Cited in the file of this patent

UNITED STATES PATENTS

| | | |
|---|---|---|
| 2,149,977 | Morton | Mar. 7, 1939 |
| 2,599,748 | Crossley | June 10, 1952 |
| 2,653,473 | Simison | Sept. 29, 1953 |
| 2,647,224 | Bruck | July 28, 1953 |
| 2,758,256 | Eisler | Aug. 7, 1956 |
| 2,830,918 | Zimmerman | Apr. 15, 1958 |
| 2,902,628 | Leno | Sept. 1, 1959 |

OTHER REFERENCES

Technograph Printed Circuit, published by the Hollen Street Press, Ltd. (London), 1952; pp. 25–29.